United States Patent
Aum

[19]

[11] Patent Number: 6,154,827
[45] Date of Patent: Nov. 28, 2000

[54] DATA PROCESSOR CAPABLE OF HIGH SPEED ACCESSING

[75] Inventor: Yoon-Sub Aum, Suwon, Rep. of Korea

[73] Assignee: SamSung Electronics Co., Ltd., Suwon, Rep. of Korea

[21] Appl. No.: 08/154,695

[22] Filed: Nov. 19, 1993

[30] Foreign Application Priority Data

Nov. 19, 1992 [KR] Rep. of Korea ............... 92-21779

[51] Int. Cl.$^7$ ............................................ G06F 12/00
[52] U.S. Cl. ............................................ 711/220; 711/2
[58] Field of Search ............................ 395/421.07, 421.08

[56] References Cited

U.S. PATENT DOCUMENTS

| | | | |
|---|---|---|---|
| 3,634,828 | 1/1972 | Myers et al. | 395/103 |
| 4,258,418 | 3/1981 | Heath | 395/250 |
| 4,361,868 | 11/1982 | Kaplinsky | 395/402 |
| 4,831,514 | 5/1989 | Turlakov et al. | 395/500 |
| 5,060,186 | 10/1991 | Barbagelata et al. | 395/402 |
| 5,108,207 | 4/1992 | Isobe et al. | 395/115 |
| 5,235,551 | 8/1993 | Sinofsky et al. | 365/230.01 |
| 5,274,786 | 12/1993 | Diehl | 395/421.08 |

*Primary Examiner*—Jack A. Lane
*Attorney, Agent, or Firm*—Robert E. Bushnell, Esq.

[57] ABSTRACT

A data processor capable of accessing data with the data processing capacity of a central processing unit (CPU), even if the data processing capacity of the CPU within the data processor is larger than the data output capacity of the memory storing the data. Such a data processor includes a temporary storage unit for storing the data outputted from the memory corresponding to the first and second address signals, respectively, applied sequentially on first and second storage areas in response to first and second storage control signals applied sequentially, and for generating the data stored in each area to the CPU at one time in response to a data output control signal of the CPU; a signal generating unit for generating the first and second storage control signals applied to the temporary storage unit in response to the least address signal of address signals provided from the CPU and a system clock, and for generating the address extension signal alternately having the first and second logic states during generating period of the data output control signal, in order to extend the address for the data; and an address signal supplying unit for jointing the address extension signal and the rest address signals excepting the least address signal of the CPU, during generating period of the data output control signal, and for supplying the jointed signal to the memory as the first and second address signals.

11 Claims, 2 Drawing Sheets

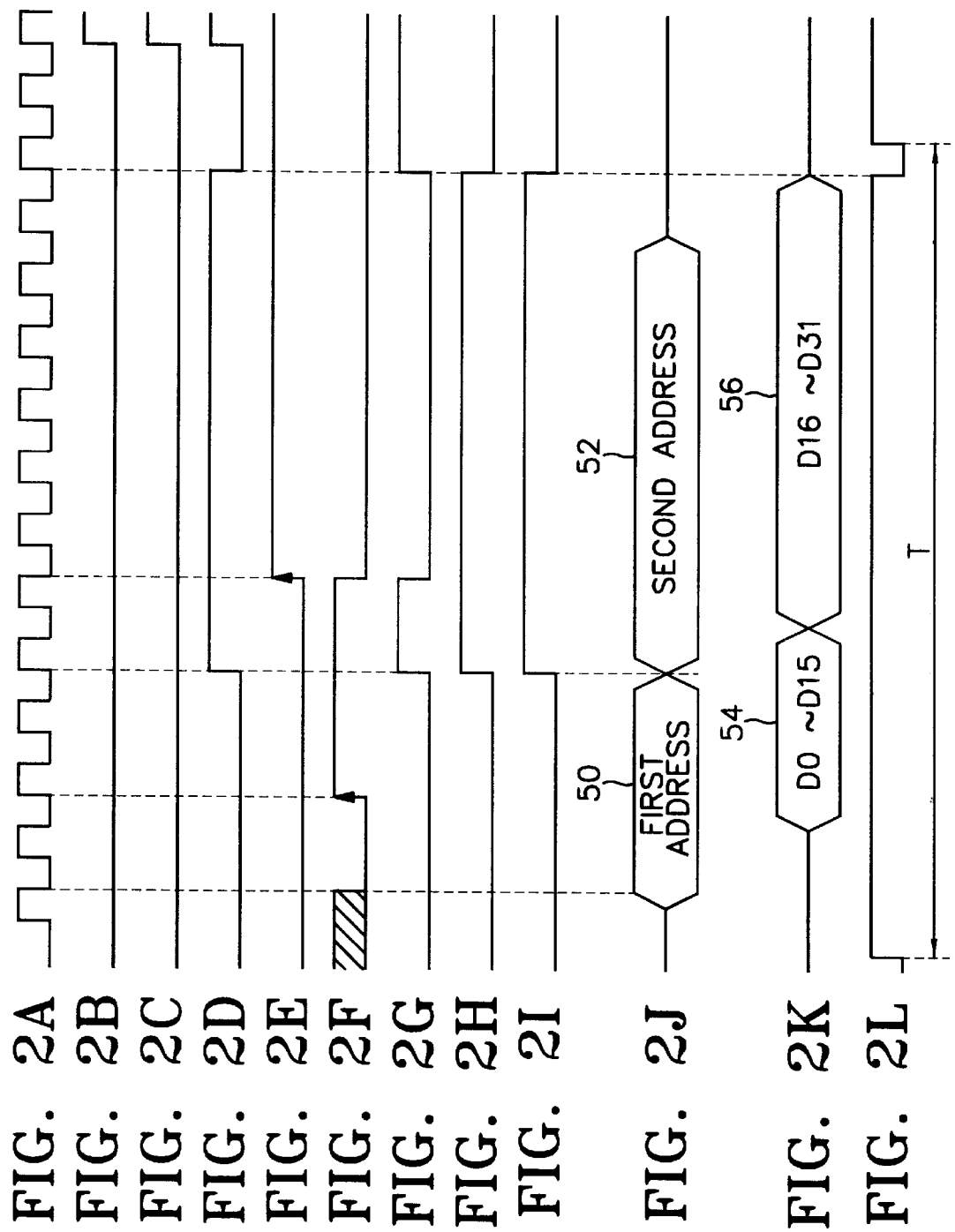

DATA PROCESSOR CAPABLE OF HIGH SPEED ACCESSING

CROSS-REFERENCE TO RELATED APPLICATIONS

This application makes reference to, incorporates the same herein, and claims all benefits accruing under 35 U.S.C. §119 from an application for Circuit For Accessing Data Of a Memory At High Speed filed in the Korea Industrial Property Office on Nov. 19, 1992 and assigned Serial No. 1992/21779.

BACKGROUND OF THE INVENTION

The present invention relates to a data processor for accessing data stored in a memory, and more particularly, to a data processor capable of accessing the data with the data processing capacity of a central processing unit (hereinafter, referred to as "CPU") even if the data processing capacity of the central processing unit within the data processor is larger than the data output capacity of the memory.

Generally, a well known data processor applies address signals to address terminals of a memory device via an address bus in order to access data stored in the memory, such as a conventional semiconductor memory, in accordance with a program previously stored in a non-volatile memory such as a read only memory (ROM). The data processor then reads the data outputted from the memory via a data bus corresponding to the address signals. Such a data processor has been used in almost all industrial fields for processing data, for example, a printer is an example of office automation machinery which includes a data processor in order to print data received from an information processing apparatus, such as a host computer, in the form of characters. In a printer, the data processor as a printing control unit has a central processing unit operated according to a program stored in a program read only memory. A font read only memory stores character pattern data in a storage area and a random access memory is used as a working memory when the central processing unit forms the print data.

At the present time, the current generation of central processing units have a thirty-two bit capacity to process data at a high speed, while the memory for storing data of various forms has been limited to sixteen bits, particularly with older peripheral devices such as printers, resulting in problems of circuit design when endeavoring to permit central processing units to accommodate the limited access capacity of such memories. Moreover, such a capacity difference brings about the problem of limitation in high speed processing of data, and therefore, the central processing unit must respectively execute addressing operations of two times in order to access the data stored in memory. Furthermore, with such a mismatch between thirty-two bit central processing units and sixteen bit memories, one technique requires that half of the data read from the memory after an addressing operation should be masked in a program since the actual data outputted from the memory is 16 bits though the data applied via the data bus is thirty-two bit. In the above mentioned printer, if the central processing unit has a thirty-two bit processing capacity and the font read only memory has sixteen bit output capacity, a problem arises in that in order to access thirty-two bits of data the central processing unit should perform address operations of two times and masking operations of two times.

As a result, the data processing operation can not be sufficiently implemented in a data processor having a central processing unit capable of processing a larger data capacity than the output data capacity of the memory. In a printer, such a data processor prevents printing speed improvement and causes an increased load on the central processing unit.

Various devices have been constructed in an attempt to increase addressable memory space so the addressing capacity of a central processing unit can be fully realized. These attempts have been unsuccessful however, and the devices contain inherent deficiencies.

The Memory Addressing Scheme of Sinofsky et al., U.S. Pat. No. 5,235,551, purports to increase addressable memory space. Individual character data is placed into one of a series of "memory planes" according to starting addresses. Each "memory plane" contains the maximum number of addresses that can be addressed by available address lines. The starting address of the data to be accessed determines the appropriate "memory plane" which must be addressed. In the preferred embodiment, the least significant nibble of each starting address is used to separate data into each "memory plane". The device utilizes a comparator to identify the current starting address of a piece of data to be accessed. Once the comparator has identified the starting address of the piece of data, a selection logic block "searches" for and selects the appropriate "memory plane" and maintains access to the data in that plane until another starting address is received and detected by the comparator. Once the comparator detects another starting address, the "searching" process repeats itself. An inherent disadvantage exists in a device which separates data into "memory planes" according to starting addresses, data can not be readily accessed. Each "memory plane" must be searched during the addressing function for the starting address of each piece of data at the outset of the addressing function and at each subsequent time the starting address of a piece of data can not be found in the "memory plane" being accessed.

In an earlier scheme, the Variable Capacity Data Buffer System of C. A. Heath, U.S. Pat. No. 4,258,418 uses a variable capacity data buffer system. To address the problem of buffer filing delays an input/output device start stop delays are different input output device unit application. A data buffer is a storage device having maximum storage capacity value for controlling transfer data between the processor and an input out device is utilized. Data is input into the data buffer storage place until it is full. The data buffer storage device subsequently outputs data to an input output device while data is replenished into the data storage device. An inherent disadvantage, resulting from the lack of a scheme to increase addressing capacity, exists in the device. The device has an addressing capacity less than its process capacity, thus, printing speed is sacrificed.

Later, the Device For Increasing The Length Of A Logic Computer Address of Kaplinsky, U.S. Pat. No. 4,361,868, sought to provide a device for increasing the length of a logic computer address. A data processing machine was contemplated with a device to extend the length of the logic address so that different logic addresses can be formed and become available to the program, as utilized. In utilizing this device, the length of a logic computer address is increased through masking operations. An inherent disadvantage exists in a device which increases the length of a logic computer address through masking operations. Printing speed is affected by the masking operation.

In a conventional dot matrix printer the method and apparatus for printing various kinds of characters by extension of a limited capacity of the font read only memory, such as the Dot-Matrix Printer With Font Cartridge Unit of U.S. Pat. No. 4,660,998 to Yulcio Tsuneld, Hanno, et al. Moreover, U.S. Pat. No. 4,660,998 describes a technique for using a font cartridge apparatus connected to a connecter in order to solve the problem of limitation of memory capacity. Assuming that the CPU of the printer, as shown in the aforementioned U.S. Pat. No. 4,660,998, has a data processing bit number larger than the data output bit number of the font read only memory or of a font cartridge, the same problems as mentioned above may occur.

SUMMARY OF THE INVENTION

It is therefore, one object of the present invention to provide a data processor which can solve the aforementioned deficiencies.

It is another object of the present invention to provide a data processor capable of accessing data with the data processing capacity of a central processing unit, even if the data processing capacity of the central processing unit within the data processor is larger than the data output capacity of the memory.

It is yet another object of the present invention to provide an improved data processing system capable of accessing data corresponding to the data processing bit number of the micro processor by a simultaneous addressing operation, in a data processing system having a structure in which the addressable capacity of the memory is half in comparison with the data processing bit number of a micro processor, and consequently, the data output bit number of the memory is half in comparison with the data processing bit number of a micro processor.

It is still another object of the present invention to provide an apparatus, including a CPU, capable of processing a larger data capacity than the output data bit number of the font ROM memory for improving the printing speed of a printing system.

In accordance with one aspect of the present invention, these and other objects may be achieved by having: a memory for storing data; a central processing unit capable of processing a larger data capacity than the output data bit number of the memory; a temporary storing unit connected to data output terminals of the memory, for storing data from the memory, corresponding to first and second address signals, respectively, applied sequentially, on first and second storage areas in response to first and second storage control signals sequentially applied, and for outputting the data stored in the respective area to the central processing unit via a data bus at one time, in response to a data output control signal of the central processing unit; a signal generating unit for generating first and second storage control signals applied to the temporary storage unit and an address extension signal alternately having first and second logic states during generating period of the data output control signal, in response to the least address signal of address signals provided from the central processing unit via the address bus and a system clock, in order to extend the address for the data; and an address signal supplying unit for joining the address extension signal and the rest of the address signals, except the least address signal of the central processing unit, during the generating period of the data output control signal, and supplying the joined signals to the memory as first and second address signals, the address extension signal so as to be the least address signal of the first and second address signals.

Preferably, the temporary storage unit may be made up of a latch member circuit having input terminals for receiving the output data of the memory, clock terminals for receiving the first and second storage control signals, output enable terminals for receiving the data output control signal, and output terminals for outputting the data stored in the respective area at one time.

Furthermore, it is desirable that the signal generating unit have configurations containing: a first generating circuit for generating a first extension control signal in response to the least address signal of the address signals provided from the central processing unit and the system clock, and for generating a second extension control signal in response to the first storage control signal and the system clock; a second generating circuit connected to the first generating circuit for generating a third extension control signal in response to the first storage control signal; a third generating circuit for generating an address extension signal alternately having first and second logic states, during the generating period of the data output control signal of the central processing unit by combining the first, second, third extension control signals and the second storage control signal; and a forth generating circuit for generating the second storage control signal by delaying the address extension signal by as much as a predetermined time and for generating the first storage control signal by inverting the second storage control signal.

In accordance with the present invention having the aforementioned configurations, the CPU or the micro processor may process the data in accord with their data processing speed, therefore the data processing speed is improved, together with getting rid of the burden of masking non-effective data.

The above objects and other advantages of the present invention will become readily apparent by describing the preferred embodiment of the present invention with reference to the attached drawings.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIGS. 2A to 2L are timing charts of waveforms taken from the detailed circuit diagram of FIG. 1.

DETAILED DESCRIPTION OF THE PREFERRED EMBODIMENT

Figure 1:
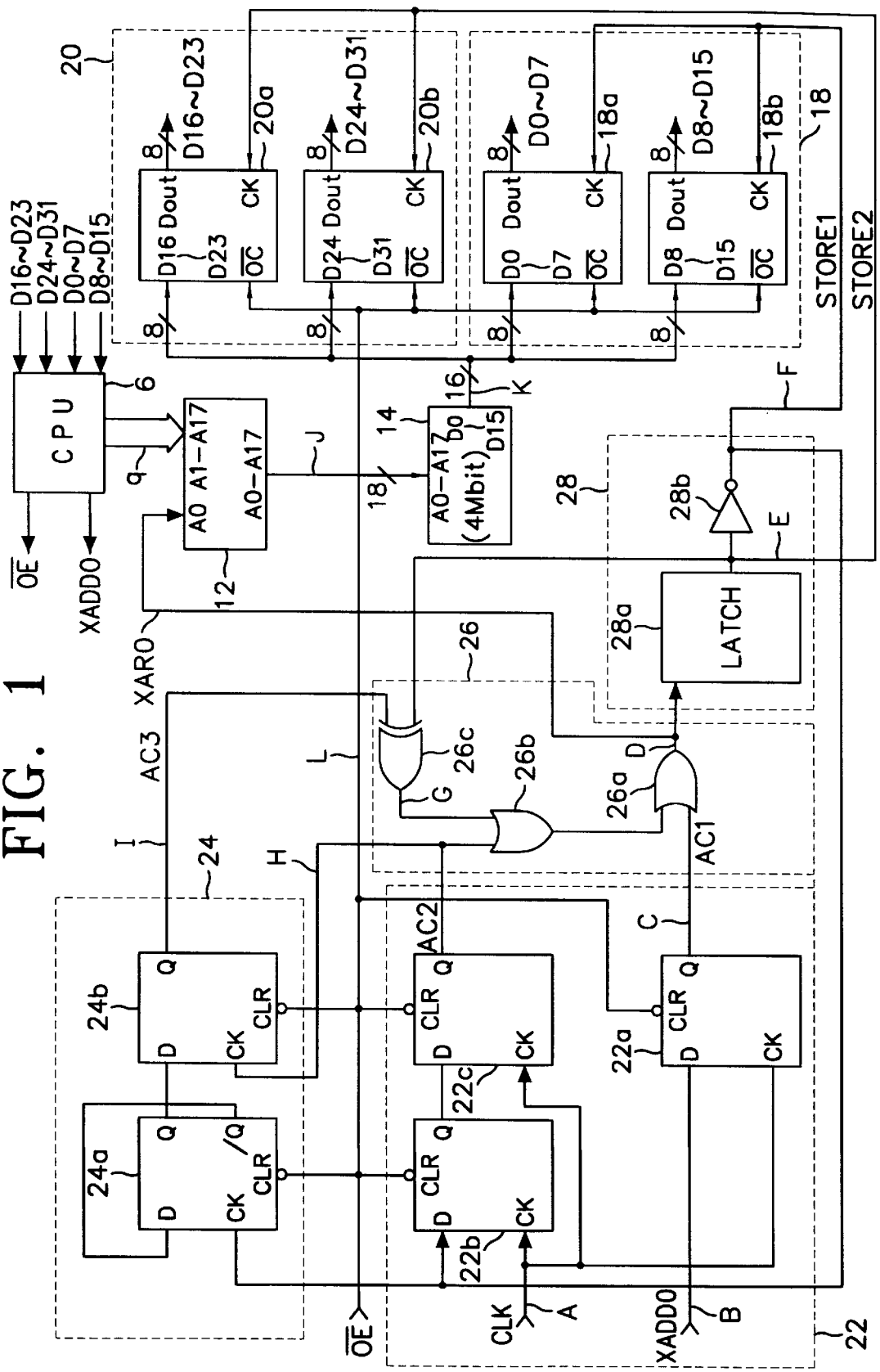
FIG. 1 is a detailed circuit diagram showing a data processor capable of high speed accessing of data constructed as one preferred embodiment according to principles of the present invention.

In the following description, numerous specific details are set forth to provide a more thorough understanding of the present invention. It will be apparent, however, to one skilled in the art, that the present invention may be practiced without these specific details. In other instances well known circuits have not been described so as not to obscure the present invention.

Referring to FIG. 1, the data processor includes a CPU 6, a CPU address bus 9, an address buffer 12, a memory (such as, for example, a font memory) 14 for storing data, register parts 18 and 20 for temporarily storing the data of the memory 14, and signal generating parts 22, 24, 26 and 28. The register parts 18 and 20 are made up of latch members 18a, 18b, 20a and 20b, in which data input terminals of the latch members are separately connected to data output terminals DO–DI5 of the memory 14. The signal generating part 22 consists of a flip-flop 22a for generating a first extension control signal AC1 in response to the least address signal XADDO of address signals supplied from the CPU and a system clock CLK, and flip-flops 22b and 22c generating a second extension control signal AC2 in response to a first storage control signal STORE1 and the system clock CLK. The signal generating part 24 connects each clear terminal to each clear terminal CLR of the respective flip-flop 22b and 22c, and is composed of flip-flops 24a and 24b for generating a third extension control signal AC3 in response to the first storage control signal STORE1. The signal generating part 26 combines the first, second and third extension control signals and a second storage control signal STORE2, and consists of logic gates 26a, 26b and 26c for generating an address extension signal XARO having alternately first and second logic states during the generating period of a data output control signal /OE of the CPU. The logic gates 26a and 26b are OR gates respectively, and the logic gate 26c is an exclusive-OR gate. The signal generating part 28 includes a latch 28a for generating the second storage control signal STORE2 by delaying the address extension signal XARO by a predetermined time, and an inverter 28b for generating the first storage control signal STORE1 by inverting the second storage control signal STORE2.

When the data processor is used for a printer, the CPU performs all operations according to the printing operation of a printing system in accordance with the program stored in a program memory. For example, assuming that the CPU is capable of processing 32 bit data and the memory 14 is a font memory of four megabit device having a data output of sixteen bits by an addressing operation of one time, a detailed configuration of each element shown in FIG. 1 will now be described.

Address input terminals Al–A17 of the address buffer 12 are connected to output terminals, except the least address signal, of a CPU via an address bus. The least address input terminal AO of the buffer 12 receives the address extension signal XARO applied from the signal generating part 26. The output terminals AO–A17 of the address buffer 12 are connected to address input terminals AO–A17 of the memory 14 through a line J which uses eighteen lines since the memory capacity of the memory 14 is four mega-bit and the data output capacity is sixteen bits. If conditions for capacity of the memory 14 are changed however, the number of lines line J consists of should be changed properly. Data output terminals DO–DI5 of the memory 14 are respectively connected to input terminals DO–DI5, D16–D31 of the register parts 18 and 20 through a line K. Latch members 18a, 18b, 20a and 20b within the register parts 18 and 20 are each made up of an 8 bit latch and have data output terminal Dout for supplying data output DO–D31 of 32 bit totally. Each output enable terminal OC of the latch members 18a, 18b, 20a and 20b respectively receives a data output control signal OE of the central processing unit. The first storage control signal STORE1 is applied to each clock terminal CK of the latch members 18a and 18b, and the second storage control signal STORE2 is applied to each clock terminal CK of the latch members 20a and 20b. The data outputs DO–D31 from the register parts 18 and 20 are connected to the CPU through a data bus not shown in FIG. 1. In some circumstances, the address extension signal XARO and the rest address signals Al–AI7, except the least address signal, of the CPU may be provided directly to the address input terminals AO–AI7 of the memory 14 not through the address buffer 12.

The system clock CLK is applied to each clock terminal CK of flip-flops 22a, 22b and 22c of D type within the signal generating part 22 through line A. The least address signal XADDO of the CPU is applied to the input terminal D of the flip-flop 22a and output terminal Q of the flip-flop 22a is connected to a line C, and clear terminal CLR of flip-flop 22a is connected to the data output control signal OE of the central processing unit. The first storage control signal STORE1 is applied to input terminal D of the flip-flop 22b and output terminal Q of the flip-flop 22b is connected to input terminal D of the flip-flop 22c. The output terminal Q of flip-flop 22c is connected to a line H. Each clear terminal CLR, of flip-flops 22b and 22c and flip-flops 24a and 24b within the signal generating part 24, is connected to the data output control signal OE of the CPU. The first storage control signal STORE1 is applied to clock terminal CK of the flip-flop 24a, input terminal D of the flip-flop 24a is connected is to its inverting output terminal Q, and output terminal Q of the flip-flop 24a is connected to input terminal D of the flip-flop 24b. Clock terminal CK of flip-flop 24b is connected to a line H and its output terminal Q is connected to a line 1. An input terminal of exclusive OR gate 26c within the signal generating part 26 is connected to the line I and its other input terminal is connected to a line E. An output terminal of gate 26c is connected to a line G whose output is provided as one input of OR gate 26b, and another input terminal of the OR gate 26b is connected to the line H. The output of OR gate 26b is provided as one input of OR gate 26a. Another input of the OR gate 26a is connected to the line C, and an output terminal of the OR gate 26a is connected to a line D.

In the signal generating part 28, an input terminal of latch 28a is connected to the line D and its output terminal is connected to the line E which is connected to the input terminal of an inverter 28b. The output terminal of the inverter 28b is connected to a line F.

Each signal is provided to a respective line, specifically a first extension control signal AC1 to the line C, a second extension control signal AC2 to the line H, a third extension control signal AC3 to the line I, the address extension signal XARO to the line D and the respective first and second storage control signals to each line F and E.

FIGS. 2A–2L show waveform signals corresponding to each respective line. FIG. 2A shows the system clock waveform applied to the line A shown in FIG. 1, and FIG. 2D shows the address extension signal generated from the line D shown in FIG. 1. That is, the address extension signal alternately has first and second logic each one time in section T shown in FIG. 2L and is provided as the least address signal of the memory 14.

Referring to FIG. 1 for describing operation according to one preferred embodiment of the present invention, central processing unit 6 provides address signals to access the memory 14. We, herewith for convenient description, assume all flip-flops within the signal generating parts 22 and 24 arc cleared. Then, if an address signal for accessing the data of thirty-two bit is outputted from the CPU, the least address signal XADDO of the address signals is applied to the input terminal D of the flip-flop 22a of D type through the line B and the other address signals Al–AI7 are applied to an address input terminal of an address buffer 12. If the least address signal has a logic 'low' as shown in FIG. 2B, the least address signal is output as a waveform shown in FIG. 2C by being latched within the flip-flop 22a by the system clock shown in FIG. 2A, and FIG. 2C is illustrated without considering the delay term a latch element has. An first extension control signal ACI is outputted as a logic 'low' on the line C, resulting in an output by OR gate 26a at D in the form of the waveform shown in FIG. 2D. The waveform shown in FIG. 2D is the address extension signal XAR0 provided as an input to latch 28a and the least address terminal AO of the address buffer 12. Accordingly, the address buffer 12 joins the signal XAR0 having a "low" condition (the first logic) in section T shown in FIG. 2L and address Al–AI7 outputted from the CPU, and applies the signal as shown in a reference No. 50 of FIG. 2J, as a first address signal, to address terminals AO–AI7 of the memory 14. Therefore, the memory 14 initially outputs 16 bit data corresponding to the applied address as shown in reference No. 54 of FIG. 2K. Further, the address buffer 12 joins the signal XAR0 is having a 'high' condition (a second logic) in section T shown in FIG. 2L and the address Al–AI7 outputted from the CPU, and applies a signal as shown in a reference No. 52 of FIG. 2J, as a second address signal, to address terminals AO–A17 of memory 14. Accordingly, the memory 14 secondly outputs 16 bit data corresponding to the applied address as shown in a reference number 56 of FIG. 2K. The least address is herewith changed so the difference between the first and second address is one. As a result, data placed on two storage areas closed by the memory 14 may be accessed sequentially, and the establishment of the difference between addresses is very effective, especially in a font read only memory storing a character pattern of similar type.

The address extension signal XAR0 having the first logic "low" condition outputted from the OR gate 26a is outputted after being delayed a few hundred msec by the latch 28a as shown in FIG. 2E. An outputting of the line E becomes the second storage control signal STORE2 and is respectively applied to each clock terminal CK of the latch members 20a and 20b. The inverter 28b linked with the output terminal of the latch 28b inverts the second storage control signal STORE2 and outputs the first storage control signal STORE1 on the line F as shown in FIG. 2F. The first storage control signal STORE1 is applied to each clock terminal CK of the latch members 18a and 18b.

Therefore, the register parts 18 and 20 store each bit of sixteen bit data as shown in reference numbers 54 and 56 of FIG. 2K by dividing it into two parts, in response to the first and second storage control signals as shown in each FIG. 2F and 2E. The point of the storage time is equal to a leading edge of the first and second storage control signal as shown in FIG. 2F and FIG. 2E.

Describing a generating process of the address extension signal XAR0 in further detail, the flip-flop 24a receives the first storage control signal STORE1 to its clock terminal CK, latches and outputs a logic 'high' through output terminal Q, and the 'high' signal is applied to the input terminal D of the flip-flop 24b. The second extension control signal AC2, shown in FIG. 2H, is generated on the line H by flip-flops 22b and 22c, which receive the first storage control signal STORE1 to input terminal D at flip-flop 22b. The third extension control signal, shown in FIG. 2I, is generated on the output line I of the flip-flop 24b. The signal shown in FIG. 2G is generated on the output line G of the gate 26c, and the output of the OR gate 26b is OR gated with the first extension control signal by OR gate 26a and outputted as shown in FIG. 2D. Accordingly, the address extension signal has the 'low' condition and 'high' condition each one time during generating period of the data output control signal.

In the condition which the register parts 18 and 20 store 32 bit data, as shown in FIG. 2K, the CPU outputs the data output control signal shown in FIG. 2L. By the output of the CPU, all the flip-flops 24a, 24b, 22a, 22b and 22c of D type are cleared and the 32 bit data stored is simultaneously applied to the CPU via the data bus. It means that the latch members 18a, 18b, 20a and 20b within the register parts 18 and 20 are enabled by the data output control signal and outputs the 32 bit data.

In accordance with one preferred embodiment of the present invention as aforementioned, even if the data processing capacity of the central processing unit within the data processor is larger than the data output capacity of the memory storing the data, the data may be accessed with the data processing capacity of the central processing unit. Furthermore, there is no need for the masking operation of the data, which reduces the burden of the central processing unit. Also, even the data processing speed may be improved in the case that the data processor uses the central processing unit capable of processing thirty-two bit data.

While preferred embodiments of the present invention have been particularly shown and described, it will be understood by those skilled in the art that foregoing and other changes in form and details may be made without departing from the spirit and scope of the present invention. For example, even though the memory having the thirty-two bit output is used for a processor capable of processing sixty-four bit data, the application of the present invention is apparent. Also the memory used may be the font read only memory in the printer case, and both a non-volatile memory and a volatile memory are applicable to the other data processor.

What is claimed is:

1. A data processor having a central processing unit (CPU) capable of accessing larger data capacity than a data output capacity of a memory storing data, comprising:

temporary storage means connected to data output terminals of a memory, for respectively storing data from said memory, corresponding respectively to first and second address signals applied sequentially, in first and second storage areas in response to first and second storage control signals sequentially applied, and for outputting the data stored in said first and second storage areas to said CPU via a data bus simultaneously, in response to a data output control signal of said CPU;

signal generating means for generating said first and second storage control signals to be applied to said temporary storage means and address extension signals alternately having first and second logic states during a generating period of the data output control signal, in response to a least address signal component of input address signals provided from said CPU via an address bus and a system clock, in order to extend the address for the data; and address signal supplying means for providing joined signals by joining said address extension signals and the input address signals except the least address signal component, during said generating period of said data output control signal, and for supplying said joined signals to said memory as said first and second address signals, with said address extension signal having said first logic state being the least address signal of said first address signals and said address signal having said second logic state being the least significant bit of said second address signal.

2. The data processor as claimed in claim 1, wherein said signal generating means comprises:

a first generating circuit for generating a first extension control signal in response to the least address signal component of said input address signals and said system clock, and for generating a second extension control signal in response to said first storage control signal and said system clock;

a second generating circuit connected to said first generating circuit and for generating a third extension control signal in response to said first storage control signal;

a third generating circuit for generating said address extension signal alternately having first and second logic states during generating period combining said first, second and third extension control signals and said second storage control signal; and a fourth generating circuit for generating said second storage control signal by delaying said address extension signal, and for generating said first storage control signal by inverting said second storage control signal.

3. A printing system having a CPU capable of accessing a larger data capacity than a data output capacity of a font memory storing character data, comprising:

a register unit connected to data output terminals of said font memory, for respectively storing data from said font memory, corresponding respectively to first and second address signals applied sequentially, on first and second storage areas in response to first and second storage control signals sequentially applied, and for providing the data stored in the corresponding areas to said CPU at one time, in response to a data output control signal;

a signal generating unit for extending the quantity of data addressable by generating said first and second storage control signals to be applied to said register unit and address extension signal alternately having first and second logic states during a generating period of the data output control signal, in response to a least address signal of address signals provided from said CPU and a system clock; and an address signal supplying unit for providing combined signals by combining said address extension signal and the input address signals excepting the least address signal component, during said generating period, and for supplying the combined signals to said font memory as said first and second address signals, with said address extension signal being the least address signal of said first and second address signals.

4. A data processing system having a structure of a half data output bit number of a memory in comparison with data processing bit number of a micro processor, said data processing system comprising:

temporary storage means connected to data output terminals of said memory, for respectively storing data outputted from said memory, respectively corresponding to first and second address signals applied sequentially, on first and second storage areas in response to first and second storage control signals sequentially applied, and for outputting the data stored in the respective area to said micro processor via a data bus at one time, in response to a data output control signal of said micro processor;

signal generating means for extending the quantity of data addressable by generating said first and second storage control signals to be applied to said temporary storage means and address extension signal alternately having first and second logic states during a generating period of the data output control signal, in response to a least address signal of address signals provided from said micro processor via an address bus and a system clock; and address signal supplying means for providing combined signals by combining said address extension signal and the input address signals excepting the least address signal component, during said generating period, and for supplying the combined signal to said memory as said first and second address signals, with said address extension signal being the least address signal of said first and second address signals.

5. A data processor capable of high speed accessing, having a central processing unit for supplying a data output control signal and address signals, comprising:

signal generating means for generating a plurality of storage control signals and first and second address extension signals;

memory means for storing data and sequentially outputting a first portion of said data in response to said address signals and said first address extension signal and a second portion of said data in response to said address signals and said second address extension signals; and a plurality of register means responsive to said data output control signal and said storage control signals, for receiving said data from said memory means in response to said storage control signals and outputting said data simultaneously in response to said data output control signal.

6. A data processor capable of high speed accessing, having a central processing unit for generating a data output control signal for a predetermined period and for generating address signals, comprising:

a signal generating means for generating first and second storage control signals and address extension signals having a first logic state during a first portion of said predetermined period and a second logic state during a second portion of said predetermined period;

memory means for storing data and sequentially outputting a first portion of said data in response to said address signals and said address extension signal having said low logic state and a second portion of said data in response to said address signals and said second address extension signal having said high logic state;

first register means responsive to said data output control signal and said first storage control signal, for receiving said first portion of said data from said memory means in response to said first storage control signal and outputting said first portion of said data in response to said data output control signal; and second register means responsive to said second portion of said data output control signal and said second storage control signal, for receiving said data from said memory means in response to said second storage control signal and outputting said portion of said data in response to said data output control signal.

7. A data processor, comprising:

system clock receiving means for receiving clock pulses;

means for receiving a central processing unit, said central processing unit supplying a data output control signal, address signals and a least address signal;

first signal generating means for generating a first extension control signal and a second extension control signal based upon said clock pulses, said least address signal and said data output control signal;

second signal generating means for generating a third extension control signal based upon said data output control signal, said second extension control signal and a first storage control signal;

third signal generating means for generating an address extension signal based upon said third extension control signal, said first extension control signal, said second extension control signal and a second storage control signal;

fourth signal generating means for generating said first storage control signal and said second storage control signal based upon said address extension signal;

address buffer means for providing a joined signal by joining said address signals and said address extension signal;

memory means for storing data, responsive to said joined signal provided by said address buffer means;

first register means responsive to said data output control signal and said first storage control signal, for receiving a first portion of said data from said memory means in response to said first storage control signal and outputting said first portion of data in response to said data output control signal; and second register means responsive to said data output control signal and said second storage control signal, for receiving a second portion of said data from said memory means in response to said second control signal and outputting said second portion of said data simultaneously with said first portion of data from said first register means in response to said data output control signal.

8. A method for accessing memory at high speeds, utilizing a system clock, a memory containing a plurality of bits of data, first and second register parts capable of temporarily storing data and a central processing unit, comprising:

generating a first storage control signal;

generating a second storage control signal;

generating a first address extension signal;

generating a second address extension signal;

generating, by said central processing unit, a data output control signal;

addressing said memory with a combination of address signals generated by said central processing unit and said first address extension signal for outputting a first portion of said plurality of bits of data;

addressing said memory with a combination of said address signals generated by said central processing unit and said second address extension signal for outputting a second portion of said plurality of bits of data;

storing said first portion of said plurality of bits of data from said memory in said first register part in response to said first storage signal;

storing said second portion of said plurality of bits of data from said memory in said second register part in response to said second storage signal; and outputting said first and said second portions of said plurality of bits of data from said first and second register parts in response to said data output control signal.

9. A data processor, comprising:

a memory with a 16 bit data output capacity for outputting stored data when addressed;

a central processing unit with a 32 bit data processing capacity for generating first and second address signals and for generating one data output control signal during a generating period;

a signal generating part for generating a first storage signal and a second storage signal and for generating address extension signals having a first and a second logic state within said generating period;

an address buffer for combining said first address signals and said address extension signal having said first logic value during an initial portion of said generating period for addressing said memory, and for combining said second address signals and said address extension signal having said second logic value during a final portion of said generating period for addressing said memory; and temporary storage means connected to said memory and said signal generating part, responsive to said first storage signal, said second storage signal and said data output control signal, for temporarily storing said data output from said memory and for simultaneously outputting said temporarily stored data in response to each said data output control signal generated by said central processing unit.

10. A data processor capable of high speed accessing, as recited in claim 9, in which said temporary storage means comprises:

a first temporary storage means connected to said memory and said signal generating part for storing first data generated from said memory by said combination of said first address signal and said address extension signal having said first logic value, in response to said first storage signal; and a second temporary storage means connected to said memory and said signal generating part for storing second address data generated from said memory by said combination of said second address signal and said address extension signal having said second logic value, in response to said second storage signal.

11. A data processor capable of high speed accessing, as recited in claim 10, in which said temporary storage means comprises:

a first temporary storage means connected to said memory and said signal generating part for storing first address data generated from said memory by said first address signal, in response to said first storage signal; and a second temporary storage means connected to said memory and said signal generating part for storing said second address data generated from said memory by said second address signal, in response to said second storage signal.

* * * * *